(12) United States Patent
Ko et al.

(10) Patent No.: US 8,010,880 B2
(45) Date of Patent: Aug. 30, 2011

(54) FORWARD ERROR CORRECTION DECODER AND METHOD THEREOF

(75) Inventors: Kyungsu Ko, Daejeon (KR); Hwang Soo Lee, Daejeon (KR); Nguyen Minh Viet, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 1293 days.

(21) Appl. No.: 11/556,546

(22) Filed: Nov. 3, 2006

(65) Prior Publication Data

US 2008/0065963 A1   Mar. 13, 2008

(30) Foreign Application Priority Data

Aug. 22, 2006   (KR) .................. 10-2006-0079501

(51) Int. Cl.
*H03M 13/00* (2006.01)
(52) U.S. Cl. ......... 714/784; 714/776; 714/762; 714/788

(58) Field of Classification Search .......... 714/751–752, 714/784, 786, 788, 759, 762, 776
See application file for complete search history.

(56) References Cited

U.S. PATENT DOCUMENTS

| 6,697,985 B1 * | 2/2004 | Ilani ............................. 714/751 |
| 2005/0286566 A1 * | 12/2005 | Tong et al. .................... 370/503 |
| 2008/0052609 A1 * | 2/2008 | Peng et al. .................... 714/799 |

FOREIGN PATENT DOCUMENTS

EP   1 009 123 A2   6/2000

* cited by examiner

*Primary Examiner* — Guy J Lamarre
(74) *Attorney, Agent, or Firm* — Foley & Lardner LLP

(57) ABSTRACT

Provided are a forward error correction decoder and a method thereof. The method comprises: generating mapping information on a location of a symbol; deciding a location of an error in a packet; deciding an erasure of a subsequent packet following the packet on the basis of the error location and the mapping information; and decoding the subsequent packet on the basis of the erasure.

5 Claims, 7 Drawing Sheets

FORWARD ERROR CORRECTION DECODER AND METHOD THEREOF

This Nonprofisional application claims priority under 35 U.S.C. §119(a) on Patent Application No. 10-2006-0079501 filed in Korea on Aug. 22, 2006, filed in Korea on the entire contents of which are hereby incorporated by reference.

BACKGROUND

1. Field

The present invention relates to a decoding method and a decoder, and more particularly, to a forward error correction (FEC) decoder and a method thereof.

2. Description of the Background Art

An error can occur even in a digital signal transmission. Specifically, in case where digital equipments transmit a large capacity of data at a fast speed, a possibility of error occurrence increases as much.

In an error detection method for checking the error, the simplest is a method for adding a bit called parity to data. The parity signifies odd and even. The method refers to a method in which the number of "1" is set to be always odd or even in digital data of "0" and "1".

For example, if an even parity is used, a parity bit of "1" is added when the number of "1" is odd in original data, and a parity bit of "0" is added when the number of "1" is even in original data. The odd parity is opposite to the even parity.

When the error is detected, a next issue is error correction. Again reading or transmitting data when the error occurrence is recognized is the easiest method. However, this method is not effective because a time for re-transmission is needed, and re-transmission is impossible in some cases.

In order to solve such a disadvantage, a method for making it possible to perform error correction as well as error detection when data is transmitted at first is suggested. This method is called a forward error correction (FEC) method in that an error to occur in the future is previously corrected. In the forward error correction method, data is repeatedly transmitted to correct the error.

Among the forward error correction methods, a Reed-Solomon coding method is widely used. In this method, when the "k" number of data and the "r" number of error correction information are added, original data can be restored if only any "k" number of data among the "k+r" number of data is read. In other words, the original data can be restored though the error occurs in up to the "r" number of data.

FIG. 1 is a block diagram illustrating a conventional transmitter of a terrestrial digital multimedia broadcasting (T-DMB) system.

A forward error correction encoder (FEC) 102 Reed-Solomon encodes and convolutional interleaves an image signal 101. A convolutional encoder 104 encodes the image signal 101 received from an energy dispersion scrambler 103. A time interleaver 105 interleaves a convolutional encoded bit in a temporal region. A main service multiplexer 108 multiplexes bit streams, such as an audio signal 106 and packet data 107, of several encoded channels to provide transmission bit streams. A convolutional encoder 111 encodes a control signal 109 received from an energy dispersion scrambler 110. A transmission frame multiplexer 112 multiplexes the multiplexed bit stream with a bit stream for the control signal. A digital audio broadcasting (DAB) symbol generator 113 converts a multiplexed transmission frame into an orthogonal frequency division multiplexing (OFDM) symbol. A transmission stage processor 114 modulates and transmits the converted OFDM symbol to a radio channel 115 through an antenna.

FIG. 2 is a block diagram illustrating a conventional receiver of the T-DMB system.

The DMB receiver receives a transmission signal from a DMB broadcasting base station over a radio channel 208. A receiver processor 207 comprises a function block such as an amplifier, a filter, a frequency down converter, and an analog-to-digital converter (ADC). Digital converted samples are detected and synchronized by a DAB symbol detector 206, and are demultiplexed by several channels. A bit stream of each channel is de-interleaved, convolutional decoded, and energy dispersion descrambled by a time de-interleaver 205, a convolutional decoder 204, and an energy dispersion descrambler 203. A forward error correction decoder 202 converts the energy dispersion descrambled bit stream into a symbol, and convolutional de-interleaves and Reed-Solomon decodes the converted symbol. The convolutional decoder 204 is vulnerable to an error group. Thus, after the convolutional decoding, the convolutional decoder 204 has the error group, not a single error, if any. Accordingly, a bit stream after the energy dispersion descrambling also has an error group.

FIG. 3 is a detailed block diagram illustrating a conventional forward error correction encoder in the transmitter of the T-DMB system of FIG. 1.

The forward error correction encoder comprises a Reed-Solomon encoder 301, a convolutional interleaver 302. The Reed-Solomon (n, k, t) encoder 301 performs encoding on a per-packet basis. The Reed-Solomon (n, k, t) encoder 301 receives a packet comprised of the "k" number of symbols, calculates the "2t" number of parity symbols, and comprises the calculated symbols in the received packet. The parity symbol is calculated on the basis of a code generator polynomial. The encoded t packet has the number of symbols obtained from Equation: n=k+2t. For example, the T-DMB system uses Reed-Solomon (104, 188, 8) codes. The output packet comprised of the "n" number of symbols is convolutional interleaved.

FIG. 4 is a detailed block diagram illustrating a conventional forward error correction decoder in the receiver of the T-DMB system of FIG. 2.

The forward error correction decoder 202 comprises a convolutional de-interleaver 401, and a Reed-Solomon decoder 402. The convolutional de-interleaver 401 receives a symbol from the energy dispersion descrambler, and de-interleaves and transmits the received symbol to the Reed-Solomon decoder 402. The Reed-Solomon (n, k, t) decoder 402 buffers and decodes the symbol after the convolutional de-interleaving to provide a Reed-Solomon input packet. The Reed-Solomon decoder 402 receives the "n" number of symbols, and outputs the "k" number of decoded symbols on the basis of the "2t" number of parity symbols. Assuming that the number of errors is denoted by "e", and the number of erasures (error whose location is recognized but value is not recognized) is denoted by "r", a total error correction of the Reed-Solomon (n, k, t) decoder 402 is obtained from Equation: 2e+r=2t.

However, not having information on error locations, the Reed-Solomon decoder 402 cannot correct the erasure, and can correct only the error. Thus, there is a drawback in that, if the number of errors is greater than "t" and less than "2t" in one packet, just one error cannot be corrected through it is within a range of the error correction (2t) of the Reed-Solomon (n, k, t) decoder 402.

FIG. 5A is a conceptual diagram illustrating the conventional convolutional interleaver in the transmitter of the T-DMB system. FIG. 5B is a conceptual diagram illustrating the conventional convolutional de-interleaver in the receiver of the T-DMB system.

As shown in FIG. 5A, the convolutional interleaver 302 has the "I" number of branches. Each branch is comprised of a shift register. The $i^{th}$ branch is comprised of the (i−1)*M number of registers and thus, can store the (i−1)*M number of symbols. The symbol outputted from the Reed-Solomon encoder 301 is cyclically stored in the shift register. If the shift register of each branch is fully filled, each branch outputs one symbol whenever receiving the symbol one by one. In such a method, the input symbol is interleaved.

As shown in FIG. 5B, the convolutional de-interleaver 401 has the "I" number of branches. Each branch is comprised of a shift register. Due to a structural characteristic of the convolutional de-interleaver 401, a sequence of a symbol error position after the convolutional de-interleaving is opposite to that of before the convolutional de-interleaving.

SUMMARY

Accordingly, the present invention is to provide a decoder and a method thereof, for improving an error correction to satisfy a bit error rate (BER) required by a communication system.

In one aspect, there is provided a forward error correction decoding method. The method comprises: generating mapping information on a location of a symbol; deciding a location of an error in a packet; deciding an erasure of a subsequent packet following the packet on the basis of the error location and the mapping information; and decoding the subsequent packet on the basis of the erasure.

Implementations may comprise one or more of the following features. For example, the packet may be a Reed-Solomon packet, and the decoding may be Reed-Solomon decoding.

Implementations may comprise one or more of the following features. For example, the Reed-Solomon packet may be generated by buffering the symbol.

Implementations may comprise one or more of the following features. For example, the symbol may be a symbol before and after convolutional de-interleaving.

Implementations may comprise one or more of the following features. For example, the decoding method may further comprise checking an effectiveness of the erasure.

Implementations may comprise one or more of the following features. For example, the checking of the effectiveness may comprise comparing an identity of the erasure before and after the Reed-Solomon decoding; and setting the erasure as an exact symbol when the identity is recognized.

Implementations may comprise one or more of the following features. For example, the decoding method may further comprise setting the erasure as an exact symbol in the subsequent Reed-Solomon packet.

Implementations may comprise one or more of the following features. For example, the decoding method may further comprise: setting the decided erasure as an exact symbol when decoding the subsequent Reed-Solomon packet.

In another aspect, there is provided a forward error correction decoder. The decoder comprises a convolutional de-interleaver, a symbol mapper, a Reed-Solomon decoder, and an erasure predictor. The convolutional de-interleaver convolutional de-interleaves a symbol. The symbol mapper generates mapping information on a location of the symbol before and after the convolutional de-interleaving. The Reed-Solomon decoder receives a Reed-Solomon packet, decides a location of an error, and corrects the error. The erasure predictor decides an erasure of a subsequent Reed-Solomon packet following the Reed-Solomon packet on the basis of the error location and the mapping information. The Reed-Solomon decoder performs subsequent Reed-Solomon decoding on the basis of the erasure.

Implementations may comprise one or more of the following features. For example, the erasure predictor may comprise an effectiveness checking unit for checking an effectiveness of the erasure.

Implementations may comprise one or more of the following features. For example, the effectiveness checking unit may compare an identity between a symbol after the Reed-Solomon decoding and the erasure, and set the erasure as an exact symbol when the identity is recognized.

Implementations may comprise one or more of the following features. For example, the Reed-Solomon packet may be generated by buffering the symbol.

In a further another aspect, there is provided a receiver comprising the forward error correction decoder.

Implementations may comprise one or more of the following features. For example, the receiver may receive a digital multimedia broadcasting signal.

The present invention is based on the fact that the number of erasures that a Reed-Solomon code can correct in one packet is twice of the number of errors. Before Reed-Solomon decoding, the erasures that the Reed-Solomon code can correct using a relationship between locations of symbols before and after a convolutional interleaver are predicted as many as possible to use a maximal error correction of the Reed-Solomon code, thereby improving a performance of decoding.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

A digital multimedia broadcasting (DMB) system is, for example, described below, but it is obvious that a spirit of the present invention is applicable to all communication and broadcasting systems using a Reed-Solomon code.

Figure 1:
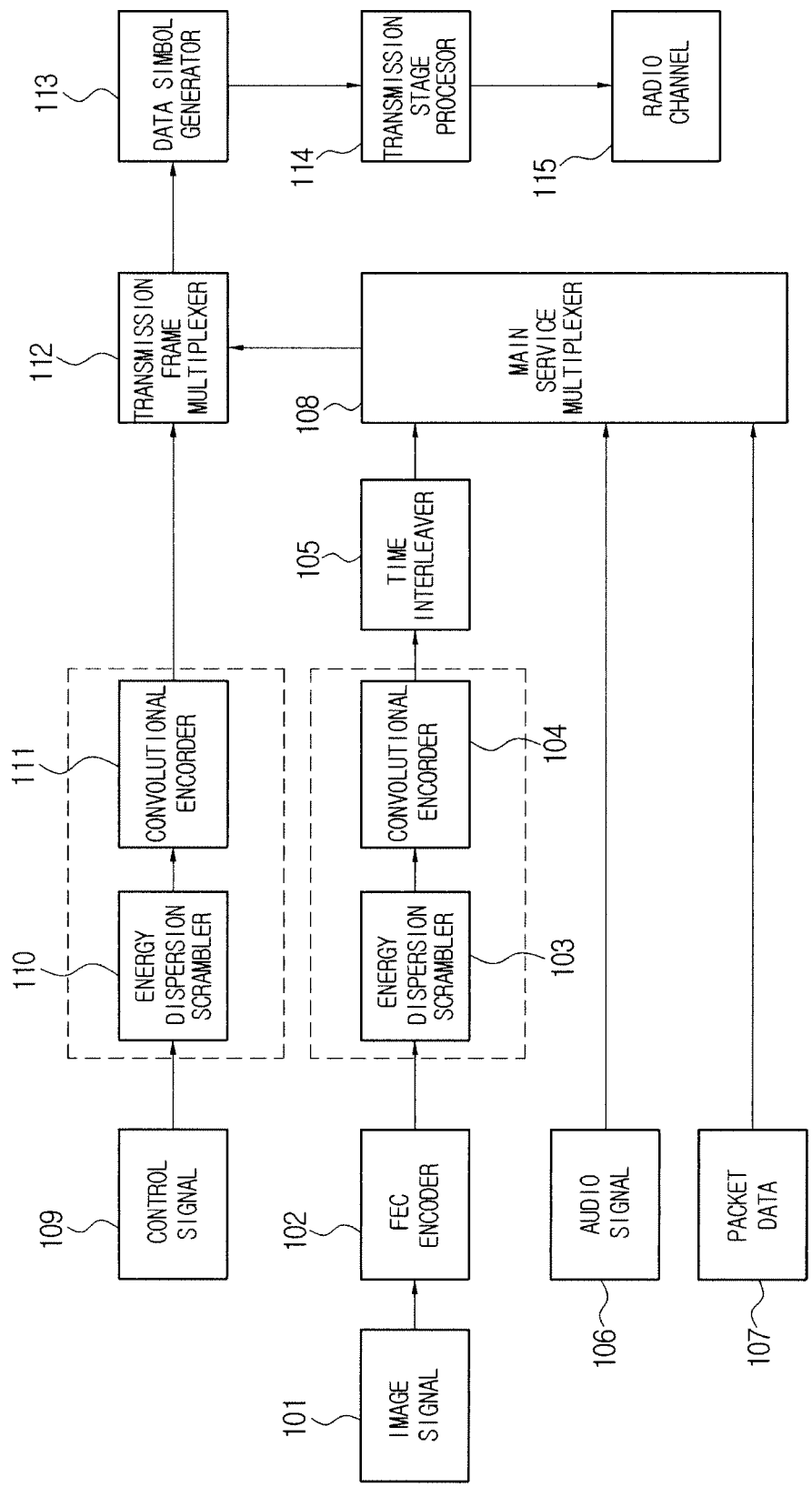
FIG. 1 is a block diagram illustrating a conventional transmitter of a terrestrial digital multimedia broadcasting (T-DMB) system.
Figure 2:
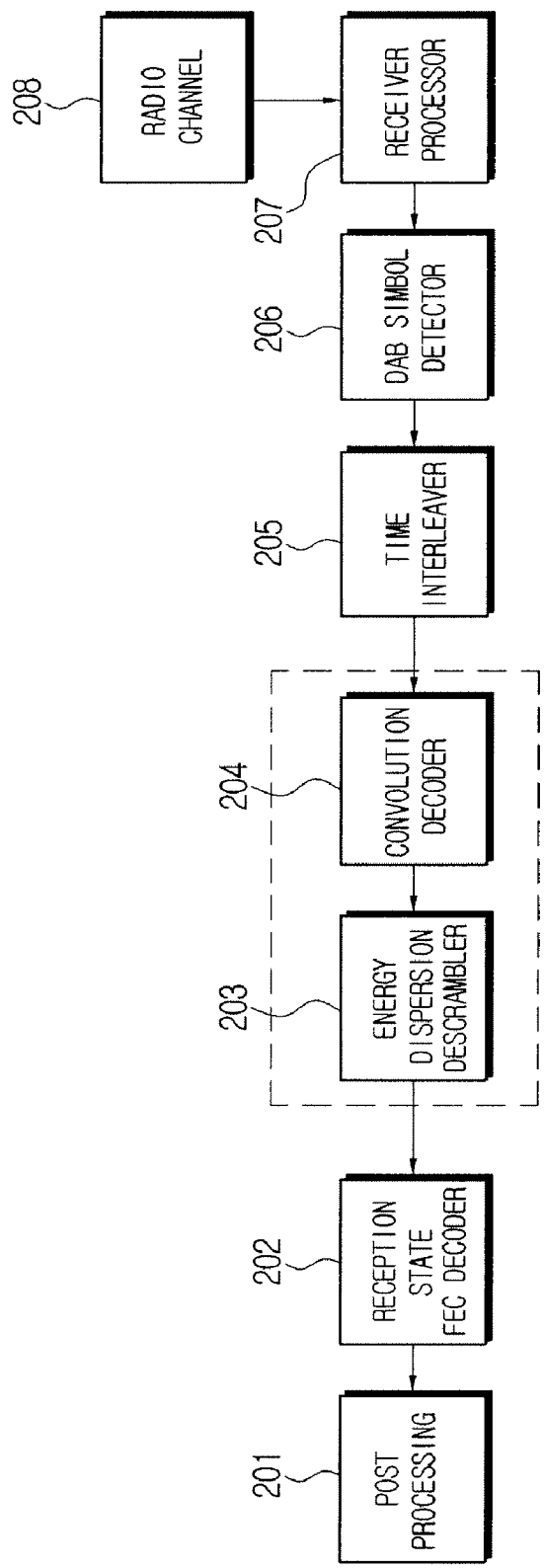
FIG. 2 is a block diagram illustrating a conventional receiver of a T-DMB system.
Figure 3:
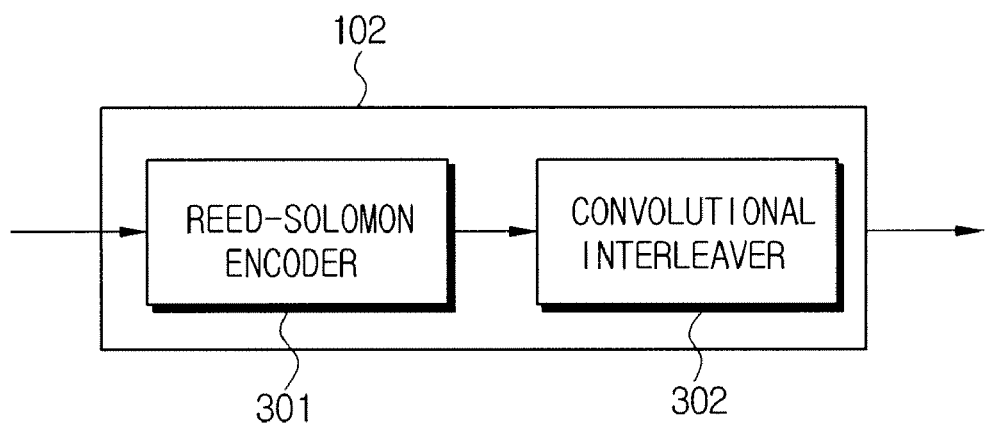
FIG. 3 is a detailed block diagram illustrating a conventional forward error correction encoder in the transmitter of the T-DMB system of FIG. 1.
Figure 4:
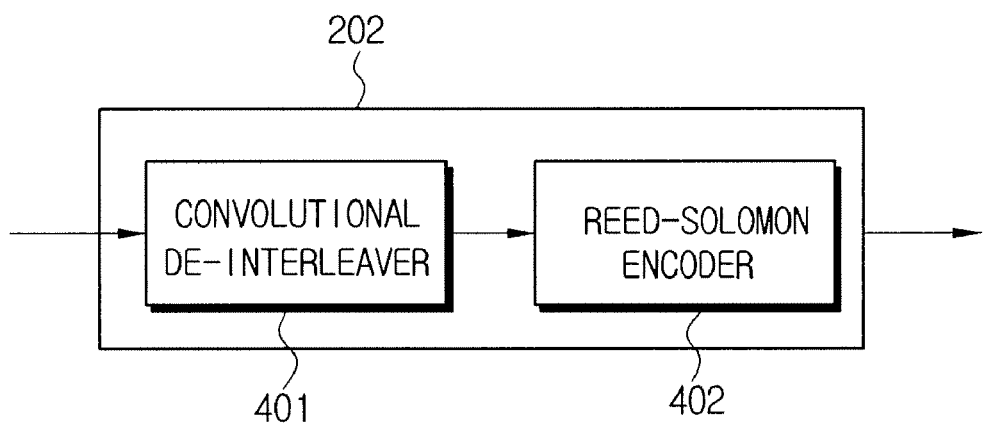
FIG. 4 is a detailed block diagram illustrating a conventional forward error correction decoder in the receiver of the T-DMB system of FIG. 2.
Figure 5:
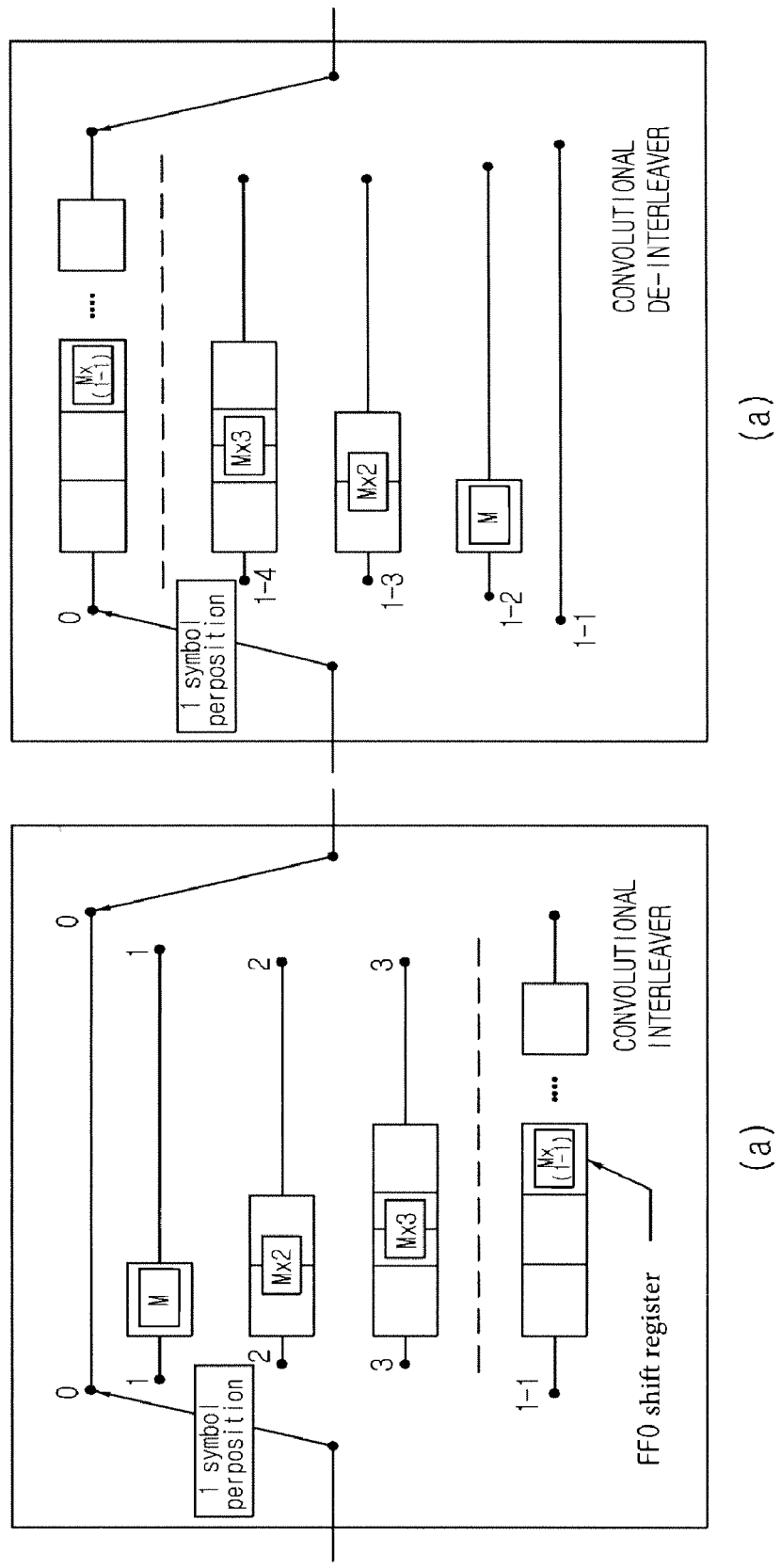
FIG. 5A is a conceptual diagram illustrating a conventional convolutional interleaver in a transmitter of a T-DMB system.
FIG. 5B is a conceptual diagram illustrating a conventional convolutional de-interleaver in a receiver of a T-DMB system.
Figure 6:
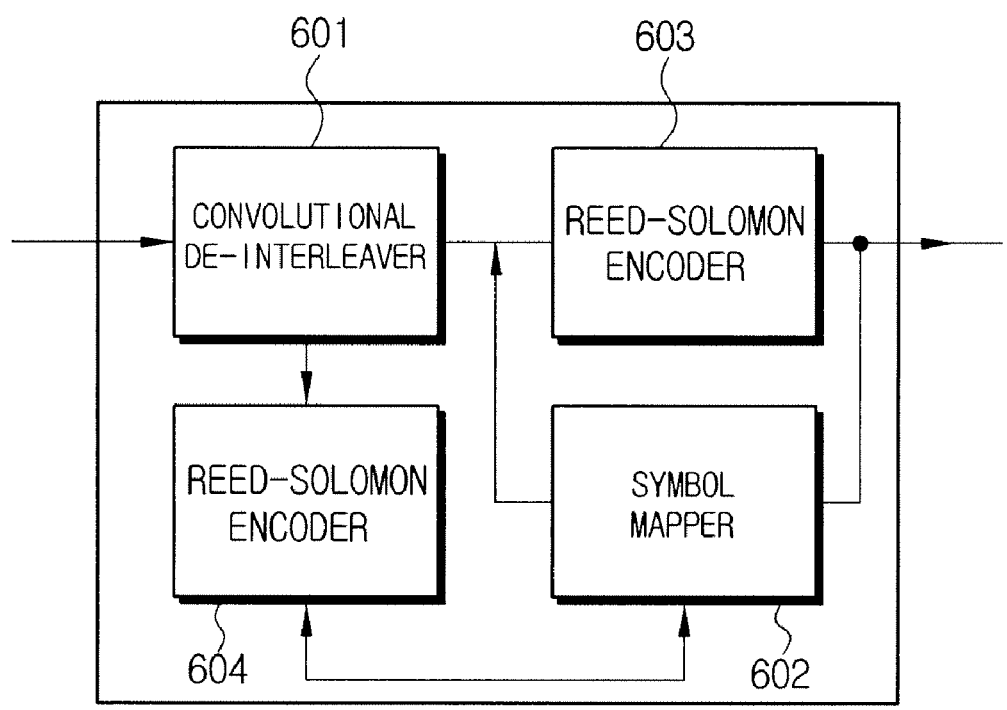
FIG. 6 is a block diagram illustrating a forward error correction decoder according to the present invention.

FIG. 6 is a block diagram illustrating a forward error correction decoder according to the present invention.

The forward error correction decoder comprises a convolutional de-interleaver 601, a Reed-Solomon decoder 603, a symbol mapper 602, and an erasure predictor 604.

The convolutional de-interleaver 601 receives and de-interleaves a symbol and then, outputs the de-interleaved symbol to the Reed-Solomon decoder 603. The convolutional de-interleaver 601 restores the symbol rearranged by a convolutional interleaver of a transmitter, to an original signal.

The Reed-Solomon decoder 603 performs Reed-Solomon decoding. Since the Reed-Solomon decoding is based on a per-packet (block) basis, not on a per-symbol basis, the symbol is buffered. Receiving the Reed-Solomon packet and finishing the Reed-Solomon decoding, the Reed-Solomon decoder 603 decides a location of a symbol error of a current packet, and corrects the symbol error.

The symbol mapper 602 maps a location of each symbol before and after the convolutional interleaving, and generates mapping information. The mapping information can be updated in a mapping table depending on each packet.

The erasure predictor 604 predicts an erasure of a subsequent non-decoded packet on the basis of information on the location of the symbol error of the current packet, and the mapping information generated in the symbol mapper or the mapping table.

The Reed-Solomon decoder 603 can perform the Reed-Solomon decoding on the basis of the erasure, and correct the error and the erasure of the subsequent non-decoded packet.

Figure 7:
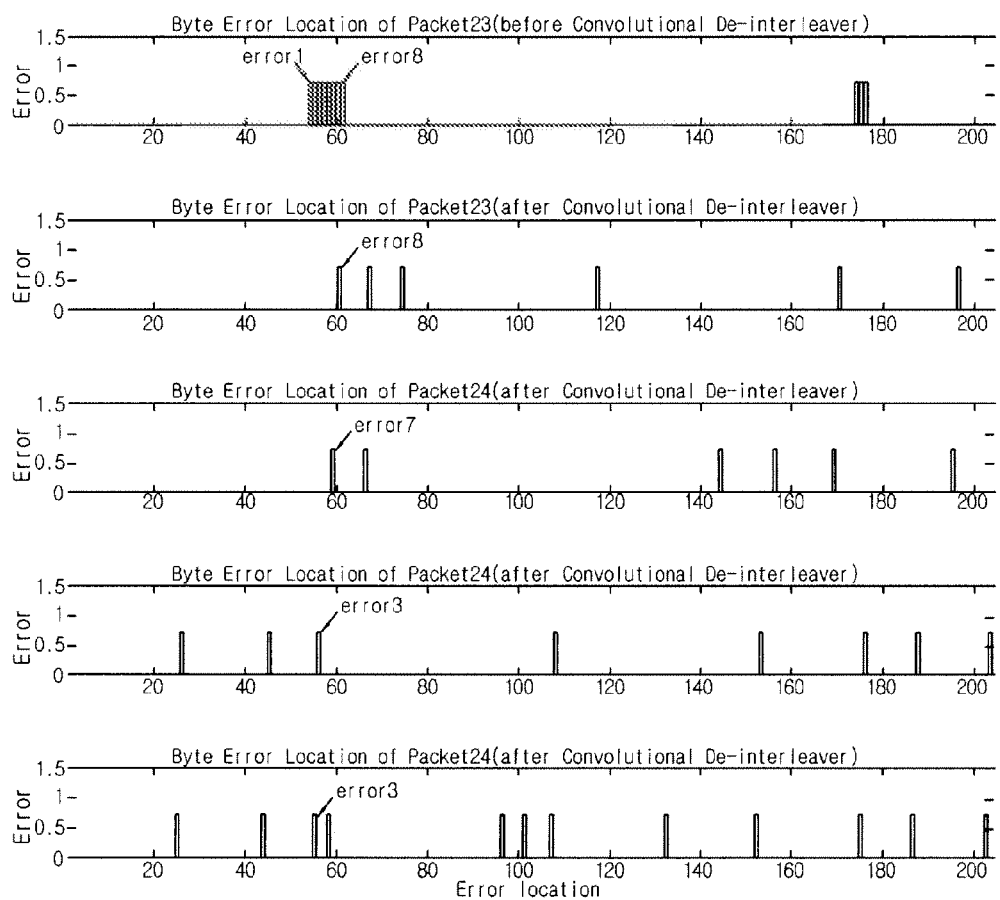
FIG. 7 illustrates a relationship of received symbols before and after convolutional de-interleaver.

FIG. 7 illustrates a relationship of received symbols before and after the convolutional de-interleaving.

FIG. 7 exemplifies a Reed-Solomon (204, 188, 8) decoder in a terrestrial digital multimedia broadcasting (T-DMB) system, using a location pattern of an error of a $23^{rd}$ Reed-Solomon packet before the convolutional de-interleaving and location patterns of errors of $23^{rd}$, $24^{th}$, $28^{th}$, and $29^{th}$ packets after the convolutional de-interleaving under Additive White Gaussian Noise (AWGN) channel and a Signal-to-Noise Ratio (SNR) of 4 dB.

One symbol is based on one byte, and an input is a packet of 204 bytes, and an output is a packet of 188 bytes. Before the convolutional de-interleaving, there is an error group (errors 1 to 8 and 9 to 12), but after the convolutional de-interleaving, the error group is rearranged in $23^{rd}$ to $30^{th}$ packets. A characteristic of the convolutional interleaver causes a sequence of the error to be opposite to before the rearrangement.

Accordingly, if the mapping table of the symbol location before and after the convolutional interleaving is prepared on the basis of the error location of the current decoded Reed-Solomon packet, the error location of the subsequent Reed-Solomon packet can be previously predicted, and the error can be used as the erasure.

Figure 8:
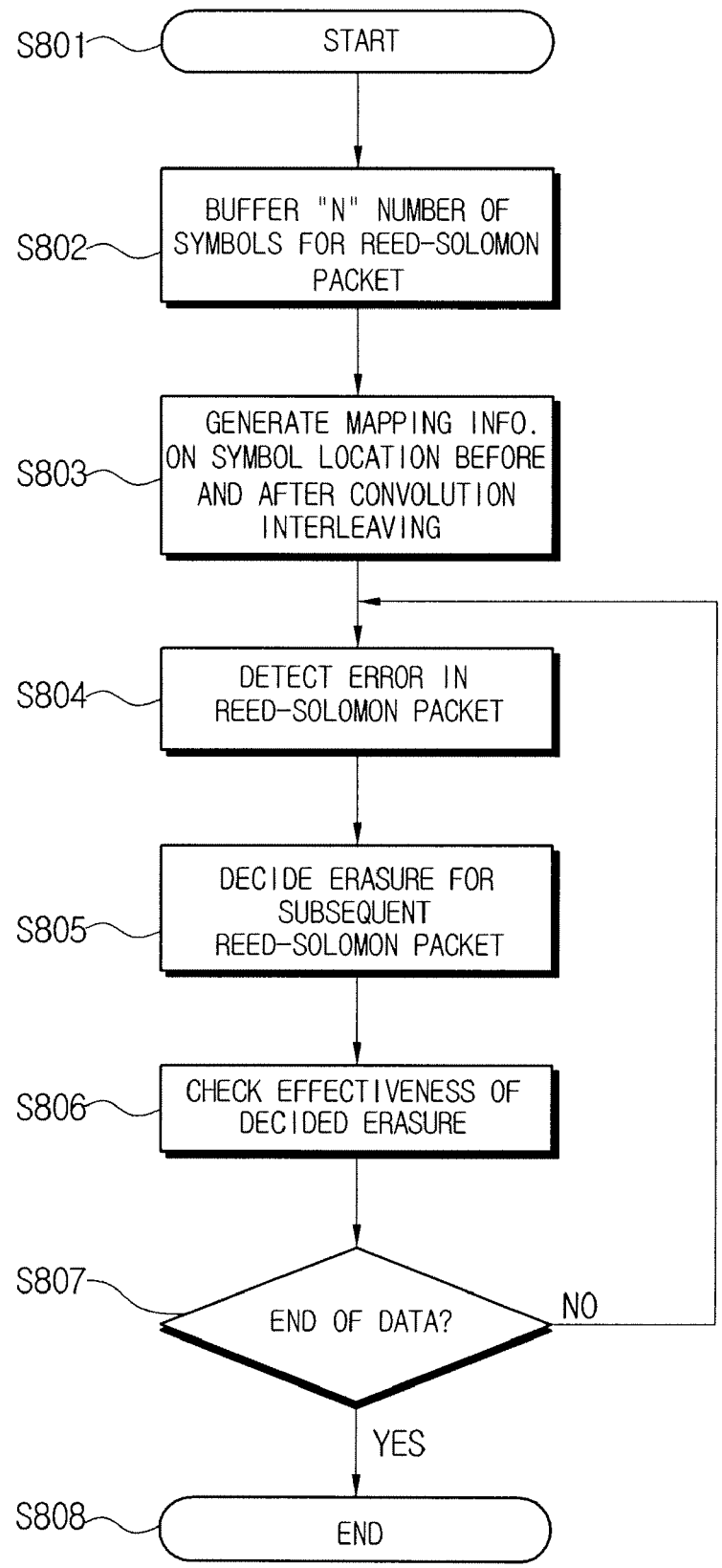
FIG. 8 is a flowchart illustrating a forward error correction decoding method according to the present invention.

FIG. 8 is a flowchart illustrating a forward error correction decoding method according to the present invention.

When the decoding starts (Step 801), the "N" number of symbols is buffered and the Reed-Solomon packet is generated to perform the Reed-Solomon decoding (Step 802). This is because the Reed-Solomon decoder performs the decoding on a per-packet (block) basis, not on a per-symbol basis.

The location of each symbol before and after the convolutional de-interleaving is mapped, and the mapping information is generated (Step 803). The mapping information can be constructed using the mapping table, and new mapping information can be updated at each packet.

When the Reed-Solomon decoding ends, the location of the symbol error of the current packet is decided, and the symbol error is corrected (Step 804). The location of the symbol error can be decided by Reed-Solomon decoding the current Reed-Solomon packet.

A location of an error of the subsequent non-decoded packet following the current packet, that is, the erasure is predicted and found on the basis of the information on the error location of the symbol of the current packet and the mapping information or the mapping table (Step 805).

The predicted erasure is not considered to be a new error in the subsequent non-decoded packet. Accordingly, location information of the predicted erasure is not used for predicting an erasure of the subsequent packet, and only a new symbol error is used for predicting the erasure of the subsequent packet.

After the predicting of the erasure, an effectiveness of an erasure of an earlier decoded packet is checked (Step 806). When the predicted erasure has no change after the decoding, it means that the predicted symbol is an exact symbol with no error. All erasures relating to this symbol in the subsequent packet are erroneously predicted erasures. Accordingly, the erasure predictor resets all the remaining predicted erasures as general symbols.

A process of deciding the error location in the Reed-Solomon packet, predicting the erasure, and checking the effectiveness of the erasure is repeatedly performed until an end of data (Steps 807 and 808).

In the present invention, a degree of prediction indicates how many subsequent packets the erasure predictor applies the current symbol error as the symbol erasure to.

It is assumed that, when the prediction degree is denoted by "M" in the receiver, one error group has the "(M+1)" number of errors to the maximum. In other words, it is assumed that one error group has the new symbol error and the "M" number of erasures before the convolutional de-interleaving whenever the Reed-Solomon decoder detects a new symbol error in one packet. The "M" number of symbol erasures is totally predicted in the "M" number of subsequent non-decoded packets.

The prediction degree will be in more detail described with reference to the pattern of FIG. 7, for example.

In FIG. 7, the $23^{rd}$ packet before the convolutional de-interleaving has two error groups. A first error group has eight sequential errors, and a second error group has three sequential errors. After the convolutional de-interleaving, the errors of the first error group are de-interleaved and dispersed to the $23^{rd}$ to $29^{th}$ packets. The first error (error 8) of the $23^{rd}$ packet after the convolutional de-interleaving can be corrected using the Reed-Solomon decoding, and its location can be recognized.

When the prediction degree is equal to "2", the locations of the errors 6 and 7 of the $23^{rd}$ packet before the convolutional interleaving are predicted in the $24^{th}$ and $25^{th}$ packet after the convolutional interleaving. When the prediction degree is equal to "3", locations of errors 5, 6, and 7 are predicted in the $24^{th}$, $25^{th}$, and $26^{th}$ packets. The prediction degree can be selected depending on actual circumstances of the receiver.

As described above, the present invention can use a maximal error/erasure correction of Reed-Solomon (n, k, t) codes, thereby making the "t" or more number of errors corrected in one packet, and improving a performance of error correction.

The present invention can satisfy a bit error rate (BER) required for stable receiving even at a SNR lower than that of a receiver using a conventional Reed-Solomon decoder, and can reduce power consumption.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A forward error correction decoder comprising:
   a convolutional de-interleaver for convolutional de-interleaving a symbol;
   a symbol mapper for generating mapping information on a location of the symbol before and after the convolutional de-interleaving;
   a Reed-Solomon decoder for receiving a Reed-Solomon packet, deciding a location of an error, and correcting the error; and
   an erasure predictor for deciding an erasure of a subsequent Reed-Solomon packet following the Reed-Solomon packet on the basis of the error location and the mapping information,
   wherein the Reed-Solomon decoder performs subsequent Reed-Solomon decoding on the basis of the erasure.

2. The forward error correction decoder of claim 1, wherein the erasure predictor comprises an effectiveness checking unit for checking an effectiveness of the erasure.

3. The forward error correction decoder of claim 2, wherein the effectiveness checking unit compares an identity between a symbol after the Reed-Solomon decoding and the erasure, and sets the erasure as an exact symbol when the identity is recognized.

4. A receiver comprising the forward error correction decoder claimed in claim 2.

5. The receiver of claim 4, receiving a digital multimedia broadcasting signal.

\* \* \* \* \*